US011862758B2

(12) United States Patent
Cherepy et al.

(10) Patent No.: US 11,862,758 B2
(45) Date of Patent: Jan. 2, 2024

(54) SYSTEMS AND METHODS FOR FLUORIDE CERAMIC PHOSPHORS FOR LED LIGHTING

(71) Applicant: Lawrence Livermore National Security, LLC, Livermore, CA (US)

(72) Inventors: Nerine Cherepy, Piedmont, CA (US); Ross Allen Osborne, Livermore, CA (US); Stephen A. Payne, Castro Valley, CA (US); Zachary Seeley, Livermore, CA (US); Alok Srivastava, Niskayuna, NY (US); William Winder Beers, Chesterland, OH (US); William Erwin Cohen, Solon, OH (US)

(73) Assignees: Lawrence Livermore National Security, LLC, Livermore, CA (US); Current Lighting Solutiosn, LLC, Cleveland, OH (US)

( * ) Notice: Subject to any disclaimer, the term of this patent is extended or adjusted under 35 U.S.C. 154(b) by 90 days.

(21) Appl. No.: 16/696,472

(22) Filed: Nov. 26, 2019

(65) Prior Publication Data
US 2020/0168770 A1 May 28, 2020

Related U.S. Application Data

(60) Provisional application No. 62/772,390, filed on Nov. 28, 2018.

(51) Int. Cl.
*H01L 33/50* (2010.01)
*F21K 9/90* (2016.01)
(Continued)

(52) U.S. Cl.
CPC .............. *H01L 33/504* (2013.01); *F21K 9/64* (2016.08); *F21K 9/90* (2013.01); *H01L 33/0095* (2013.01);
(Continued)

(58) Field of Classification Search
CPC .............................. H01L 33/502; H01L 33/50
See application file for complete search history.

(56) References Cited

U.S. PATENT DOCUMENTS 7,497,973 B2   3/2009  Radkov et al.
7,648,649 B2   1/2010  Radkov et al.
(Continued)

FOREIGN PATENT DOCUMENTS

JP       2007039303 A     2/2007
WO    WO-2009101578 A1    8/2009
WO    WO-2017196779 A1   11/2017

OTHER PUBLICATIONS

Pust, Philipp, et al. "A Revolution in Lighting." Nature Materials, 14, 5, 454-458 (2015).
(Continued)

*Primary Examiner* — Andrew J Coughlin
(74) *Attorney, Agent, or Firm* — Harness, Dickey & Pierce, P.L.C.

(57) ABSTRACT

The present disclosure relates to a lighting component which may comprise a light emitting diode (LED) or laser diode (LD) for generating at least one of blue light or ultraviolet light. A fluoride phosphor matrix may be included, which may be consolidated into a phosphor ceramic structure including at least one of a transparent fluoride ceramic structure or a translucent fluoride ceramic structure, and positioned adjacent to the LED or LD. The phosphor ceramic structure generates at least one of red or orange light when irradiated by the light emitted from the LED or LD. The phosphor ceramic structure exhibits reduced thermal quenching relative to a fluoride particulate structure irradiated by the LED or LD.

28 Claims, 7 Drawing Sheets

(51) Int. Cl.
- H01L 33/64 (2010.01)
- H01L 33/00 (2010.01)
- F21K 9/64 (2016.01)
- *F21Y 115/30* (2016.01)
- *F21Y 115/10* (2016.01)

(52) U.S. Cl.
CPC ......... H01L 33/641 (2013.01); *F21Y 2115/10* (2016.08); *F21Y 2115/30* (2016.08); *H01L 2933/0041* (2013.01)

(56) References Cited

U.S. PATENT DOCUMENTS

| | | | |
|---|---|---|---|
| 7,737,457 | B2 | 6/2010 | Kolodin et al. |
| 9,698,314 | B2 | 7/2017 | Murphy et al. |
| 9,929,319 | B2 | 3/2018 | Setlur et al. |
| 10,349,484 | B1* | 7/2019 | Zhang .................. H05B 45/20 |
| 2009/0256167 | A1* | 10/2009 | Peeters ................ H01L 33/507 257/98 |
| 2015/0054400 | A1 | 2/2015 | Murphy |
| 2015/0076406 | A1 | 3/2015 | Zhou et al. |
| 2018/0226545 | A1* | 8/2018 | He ....................... H01L 33/504 |
| 2018/0347785 | A1* | 12/2018 | Kawaguchi ............... F21K 9/64 |

OTHER PUBLICATIONS

Leaño, Julius L., et al. "Critical Review-Narrow-Band Emission of Nitride Phosphors for Light-Emitting Diodes: Perspectives and Opportunities." ECS Journal of Solid State Science and Technology, 7, 1, R3111-R3133 (2017).

S. Li, R .-J. Xie, T. Takeda, N. Hirosaki, "Review-Narrow-Band Nitride Phosphors for Wide Color-Gamut White LED Backlighting," ECS J. Sol. State Sci. Tech., 7 (1) R3064-R3078 (2018).

US Department of Energy Solid-State Lighting "Research and Development Multi-Year Program Plan" (2014), http://apps1.eere.energy.gov/buildings/publications/pdfs/ssl/ssl_mypp2014_web.pdf.

BLUEPRINT: California Energy Commission Efficiency Division, The Lighting Issue 117 Nove.-Dec. 2016, http://www.energy.ca.gov/2016publications/CEC-400-2016-027/CEC-400-2016-027.pdf> 027/CEC-400-2016-027.pdf <http://www.energy.ca.gov/2016publications/CEC-400-2016-027/CEC-400-2016-027.pdf.

T.M. Tolhurst , S. Schmiechen , P. Pust , P.J. Schmidt, W. Schnick , A. Moewes, "Electronic Structure, Bandgap, and Thermal Quenching of $Sr[Mg_3SiN_4]$:Eu 2+ in Comparison to $Sr[LiAl_3N_4]$:Eu 2+," Adv. Optical Mater., 4, 584-591 (2016).

H.F. Sijbom, R. Verstraete, J.J. Joos, D.Poelman, and P.F. Smet, "$K_2SiF_6$:Mn4+ as a red phosphor for displays and warm-white LEDs: a review of properties and perspectives," Opt. Mat. Express, 7, 9, 3332-3365 (2017).

Lin, Chun Che, et al. "Critical Red Components for Next-Generation White LEDs." The J. Phys. Chem. Lett., 7, 3, 495-503 (2016).

US Department of Energy Solid-State Lighting "Building Technologies Program Solid-State Lighting Technology Fact Sheet" (2014), https://www.energy.gov/sites/prod/files/2014/04/f14/life-reliability_fact-sheet.pdf.

Reinert Verstraete et al. "Ren Mn4-Doped Fluoride Phosphors: Why Purity Matters", ACS Appl. Mater. Interfaces, No. 10, (2018) pp. 18845-18856.

Reinert Verstraete et al. "$K_2MnF_6$ as a precursor for saturated red fluoride phosphors: the struggle for structural stability", J. Mater. Chem. C, No. 5, (2017) p. 10761-10769.

* cited by examiner

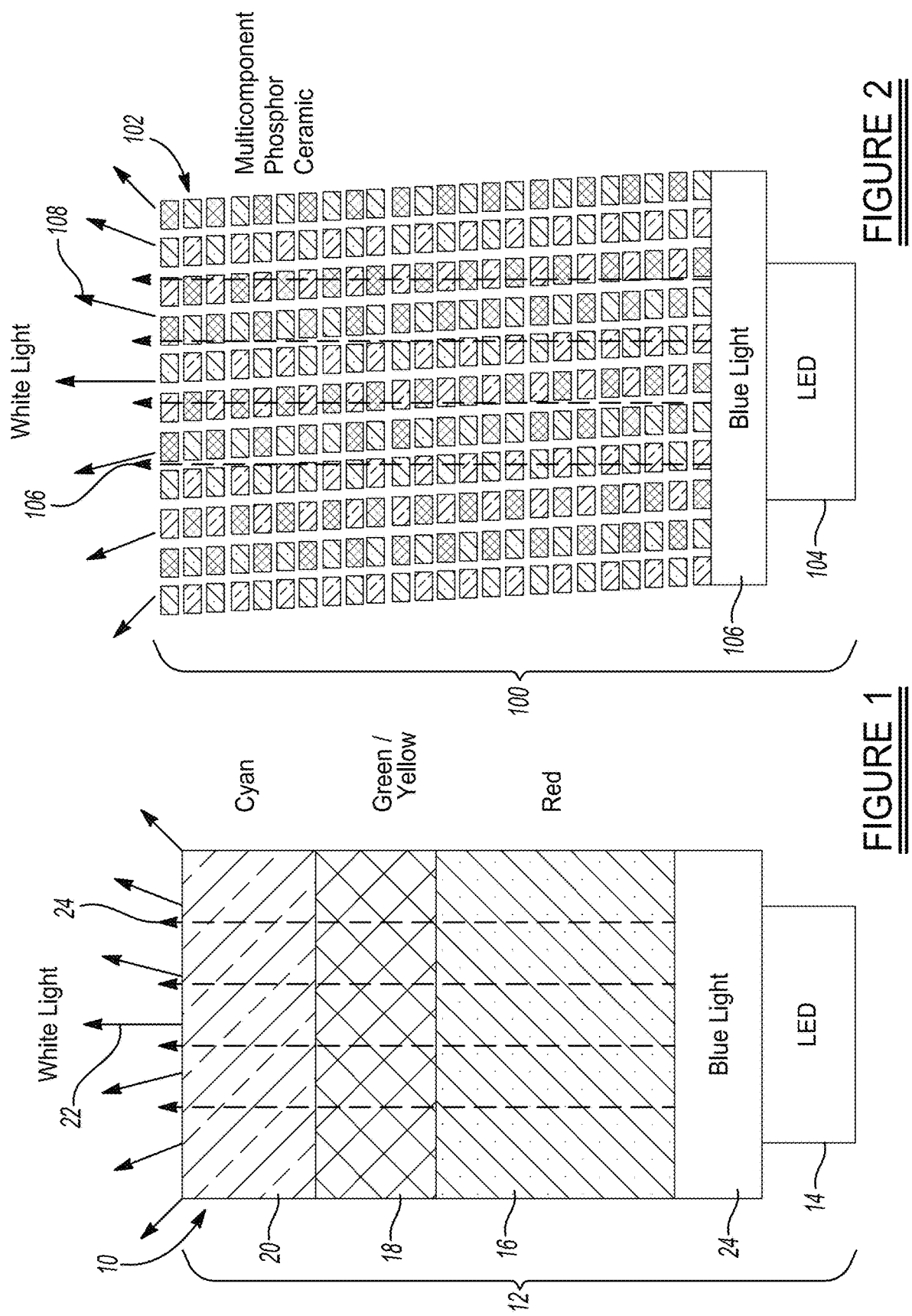

SYSTEMS AND METHODS FOR FLUORIDE CERAMIC PHOSPHORS FOR LED LIGHTING

CROSS-REFERENCE TO RELATED APPLICATIONS

This application claims the benefit of U.S. Provisional Application No. 62/772,390, filed on Nov. 28, 2018. The entire disclosure of the above application is incorporated herein by reference.

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to systems and methods for Light Emitting Diode (LED) and laser-diode (LD) based lighting, and more particularly to consolidated phosphor ceramics that convert blue light from LEDs and/or LDs into a tunable white light spectrum.

BACKGROUND

This section provides background information related to the present disclosure which is not necessarily prior art.

Phosphor-converted white light LEDs (pc-LEDs) offer significant advantages over conventional lighting sources such as incandescent and fluorescent lamps. In particular, pc-LEDs can provide for higher efficacy (lumens/watt) and long lamp lifetime (lumen and color maintenance). In pc-LEDs, a highly efficient (Ga,In)N semiconductor chip emits blue light ($\lambda_{max}$ ~450 nm) with a full width at half maximum (FWHM) of 10-25 nm. This blue light is then combined with partially down-converted green/yellow- and orange/red-emitting phosphors to produce white light. To a much lesser extent, LD's are also converted to white light by exciting phosphors with the blue light from the laser, and early commercial products of this nature are known to practitioners in the field of lighting technologies.

A red phosphor with a desirable emission spectrum is critical to simultaneously achieving high efficiency, high color rendering index (CRI) and sufficient red component (defined as "R9") to produce "warm white" light. Another crucial parameter is the Correlated Color Temperature (CCT), which relates to the perceived "black-body" temperature of the lamp. A narrow emission band for the red phosphor is needed, since red is at the edge of human eye sensitivity, and therefore near infrared emission at wavelengths of >650 nm is essentially wasted and degrades the device efficacy. The U.S. Department of Energy goal for pc-LED lighting is 220 lm/W by 2020. In certain states, for example in California, Title 24 requires new residential construction to utilize lighting that provides a CRI >90, R9 >50, CCT <4000 K and efficacy >45 lm/W. To achieve these requirements and push the efficacy limits, a red phosphor with emission at 615-640 nm and FWHM <40 nm is critically enabling.

Some other important requirements for practical use include high quantum efficiency, low thermal quenching, low excited state absorption losses, strong ground state absorption at 450 nm, long-term chemical stability under ambient conditions, and chemical composition employing Earth-abundant elements, preferably available at low cost and with low toxicity. Several commercial red phosphors have favorably centered emission peaks in the 600-630 nm range, such as SBSN, $(Sr,Ba)_2Si_5N_8:Eu^{2+}$ and SCASN, $(Ca,Sr)AlSiN_3:Eu^{2+}$, but have characteristic broad bandwidths of >70 nm that extend into the undesirable (eye-insensitive) infrared region. Another red phosphor, SLA ($SrLiAl_3N_4:Eu^{2+}$), has a relatively narrow emission (FWHM=50 nm) but peaks at an excessively long wavelength of ~650 nm. One outstanding red phosphor, $K_2SiF_6:Mn^{4+}$ (KSF), offers four sharp peaks in the 610-650 nm range, and meets most of requirements for LED lighting listed above. However, with KSF, excited state losses limit its use in high-flux packages, which also can induce heating of the phosphor such that the emission begins to quench via thermal mechanisms. KSF powders can also exhibit some environmental degradation derived from slight water reactivity with high surface area powder on the timescale of LED fixture lifetimes of >20,000 hours, consistent with 10-20 years depending on frequency of use.

SUMMARY

In one aspect the present disclosure relates to an LED component. The LED component may comprise a light emitting diode (LED) for generating at least one of blue light or ultraviolet light. A fluoride phosphor matrix may be included, the fluoride phosphor matrix being consolidated into a phosphor ceramic structure including at least one of a transparent fluoride ceramic structure or a translucent fluoride ceramic structure, and positioned adjacent to the LED. The phosphor ceramic structure generates at least one of red or orange light when irradiated by the light emitted from the LED. The phosphor ceramic structure exhibits reduced thermal quenching relative to a fluoride particulate or powder/polymer composite structure irradiated by the LED.

In another aspect the present disclosure relates to a light emission device. The light emission device may comprise a fluoride phosphor consolidated into a ceramic structure, wherein the ceramic structure is substantially free of an organic binder. The ceramic structure is operable to be disposed adjacent to an excitation light source emitting light of a first wavelength, and to modify the light of the first wavelength passing therethrough to emit light having a second wavelength longer than the first wavelength.

In still another aspect the present disclosure relates to a method for forming a light modifying structure. The method may comprise providing a fluoride ceramic with one or more phosphor phases dispersed within it to absorb and emit light within a specified wavelength spectrum. Such ceramics may be formed by heating the powders to a temperature within a predetermined temperature range. While maintaining the powders heated to the temperature within the predetermined temperature range, the method may further include placing the powders under a pressure within a predetermined pressure range in a machine, and maintaining the powders under the pressure for a predetermined time interval sufficient to cause the powders to consolidate into a phosphor ceramic structure. The method may then further include allowing the phosphor ceramic structure to cool, and then removing the phosphor ceramic structure from the machine.

Conventional means of consolidating ceramics (in general) include vacuum sintering, spark plastic sintering (SPS), and hot-pressing. However, the first two of these methods include limitations that limit their applicability with phosphor powders. For example, with vacuum sintering, one would need to start with nanoparticles in order to have the "driving force" for consolidation based on reducing the surface area of the particles as they grow, and synthesis and handling of nanoparticles add complexity and cost. For the case of SPS, this processing is recognized to be less controllable and more expensive than other heat/temperature processing processes, which often leads to less transparent finished parts. SPS is typically employed to keep the particle size as small as possible, which is not always needed, and can also introduce additional challenges. In contrast, we have shown that carefully adjusting the hot-pressing conditions under which KSF is has been consolidated has consistently led to the fabrication of transparent ceramic parts where one is able to "see through" the KSF ceramic, and for example read letters on a page.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings, in which:

FIG. 1 is a high level illustration of one embodiment of a multicomponent phosphor ceramic which may be used with a blue LED to generate tunable white light, and where the multicomponent ceramic is constructed using distinct layers of red, green/yellow and cyan phosphors;

FIG. 2 is a high level illustration of another embodiment of a multicomponent phosphor ceramic which also uses KSF:Mn (red), a Ce-doped garnet (green/yellow) and $BaSi_2O_2N_2$:Eu (cyan), but in a homogeneous mixture of consolidated powders;

Figure 5:
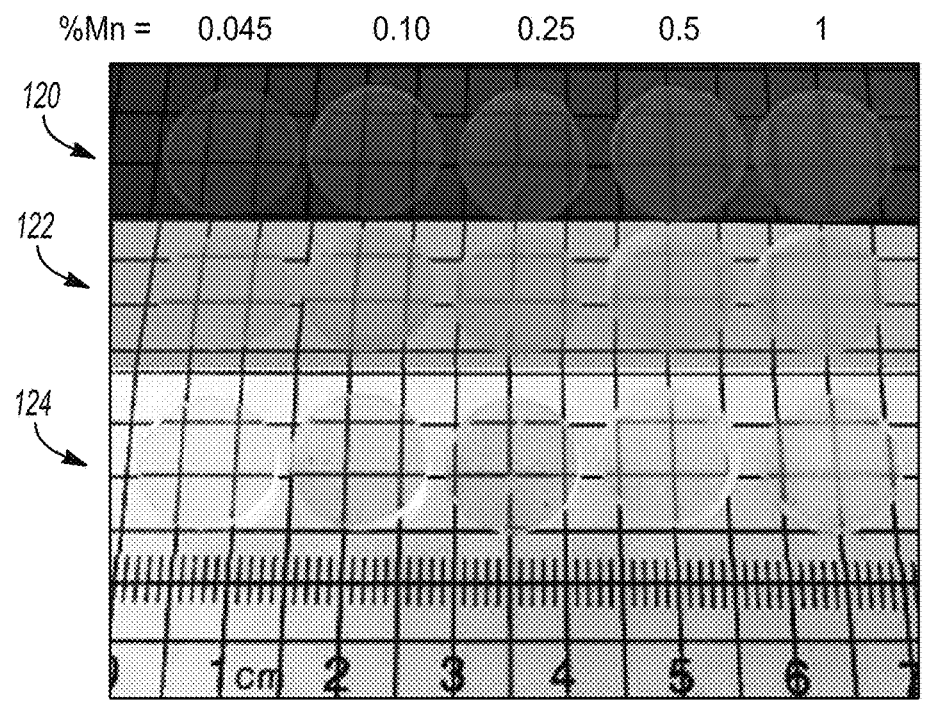
Figure 6:
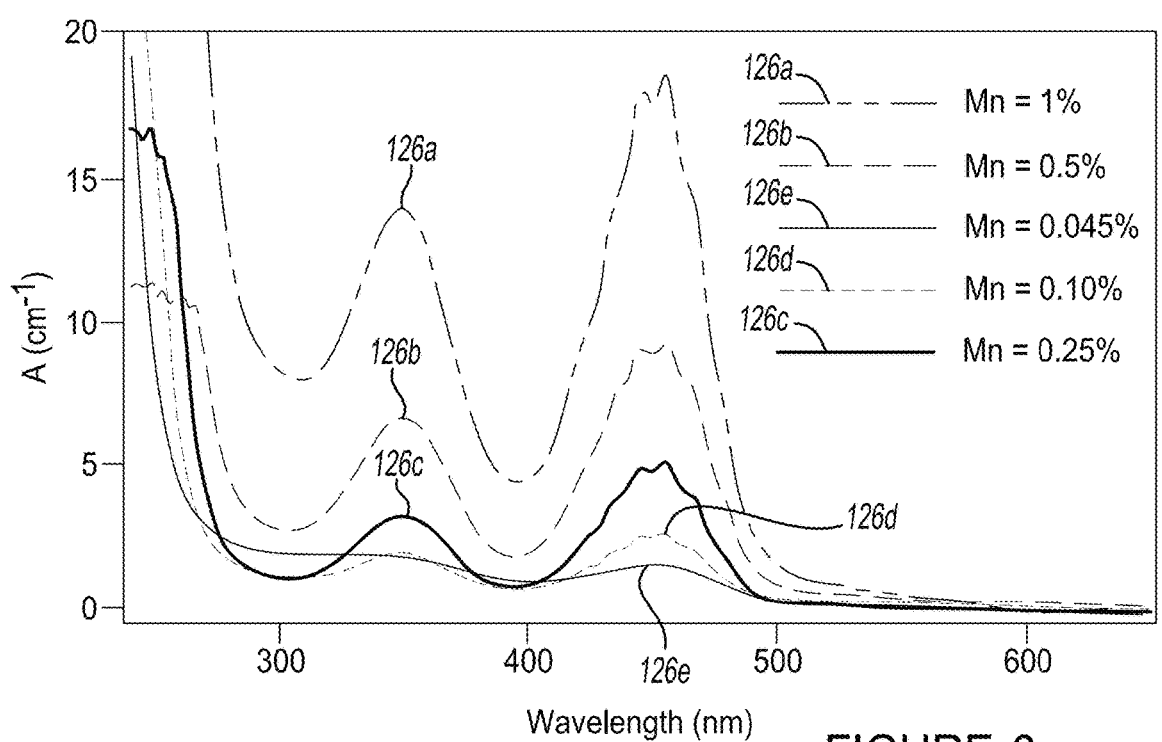
Figure 7:
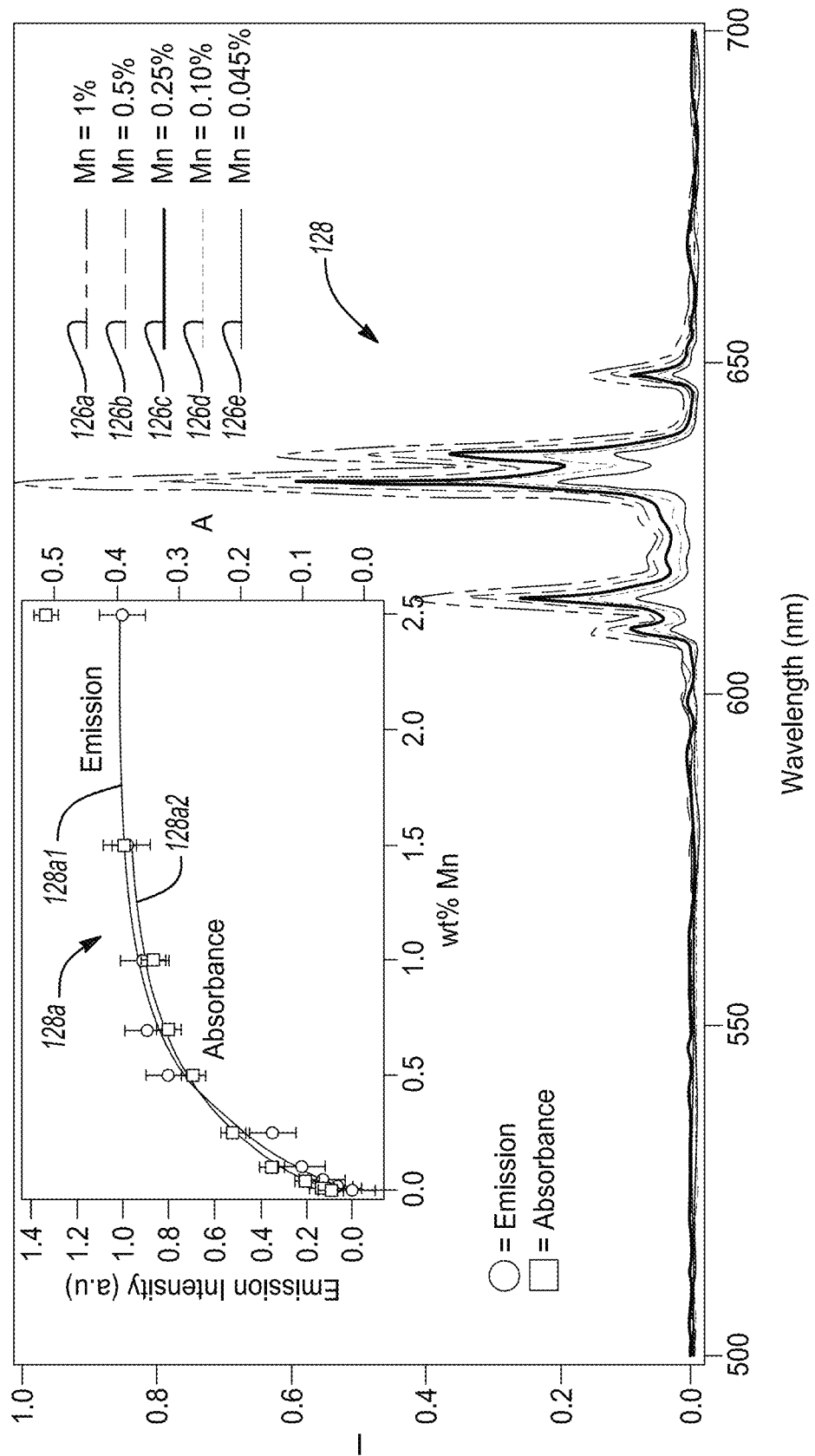
Figure 8:
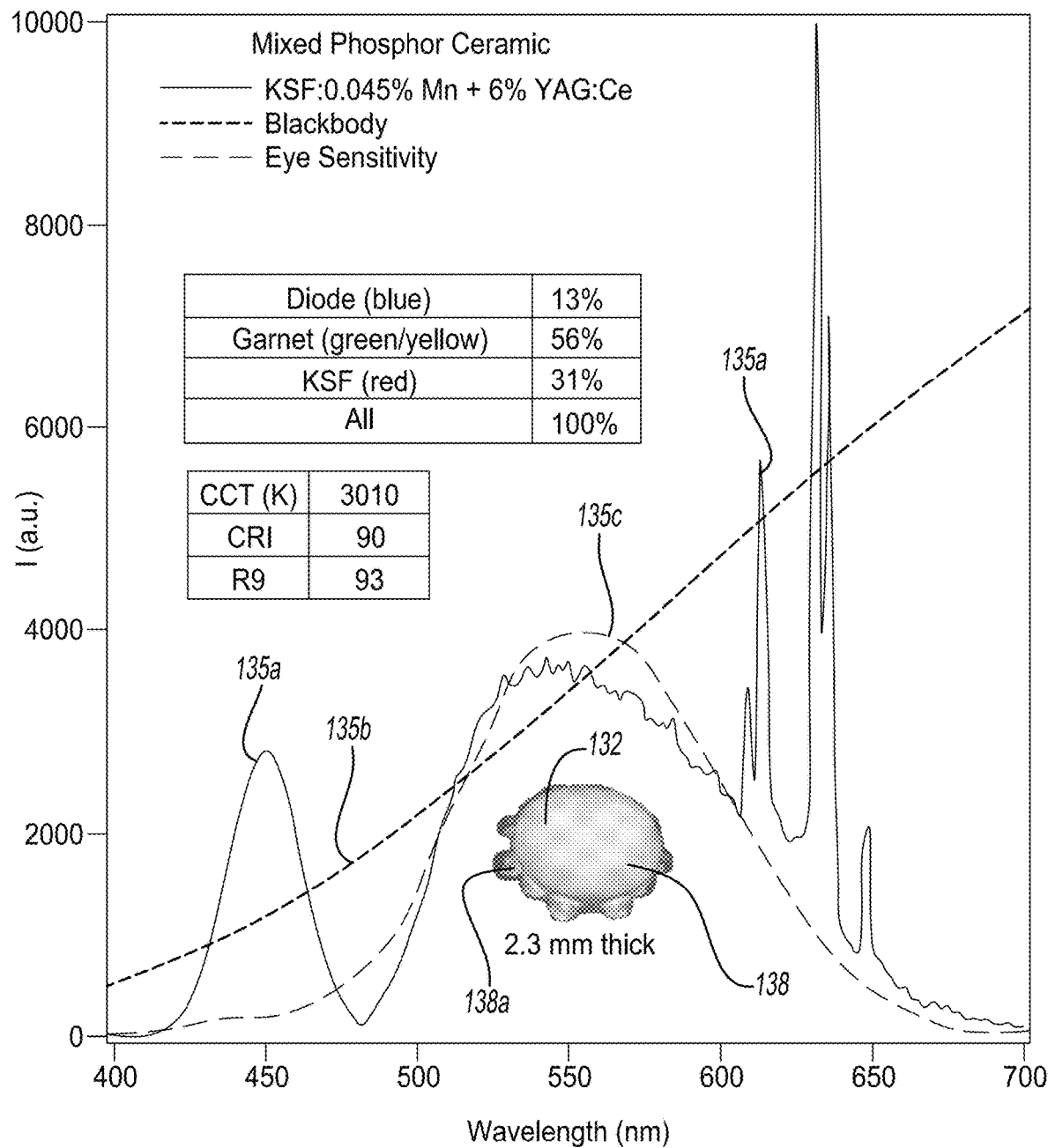
Figure 9:
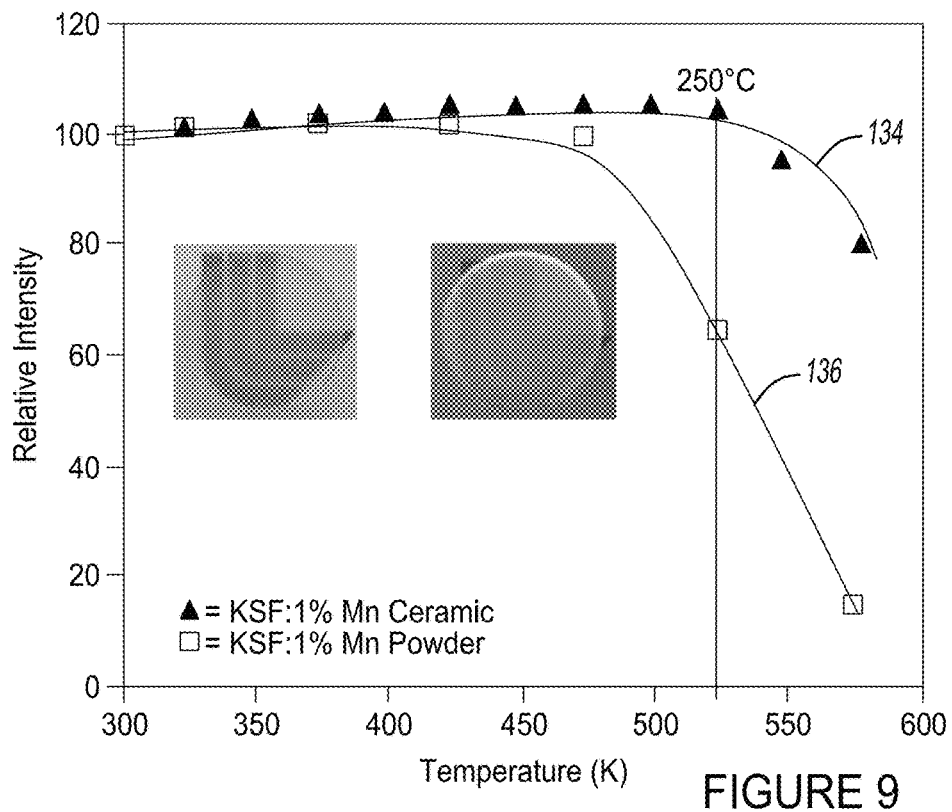
Figure 10A:
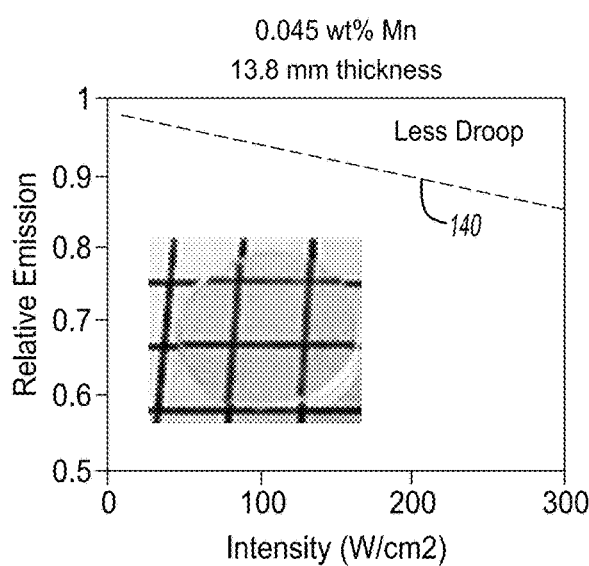
Figure 10B:
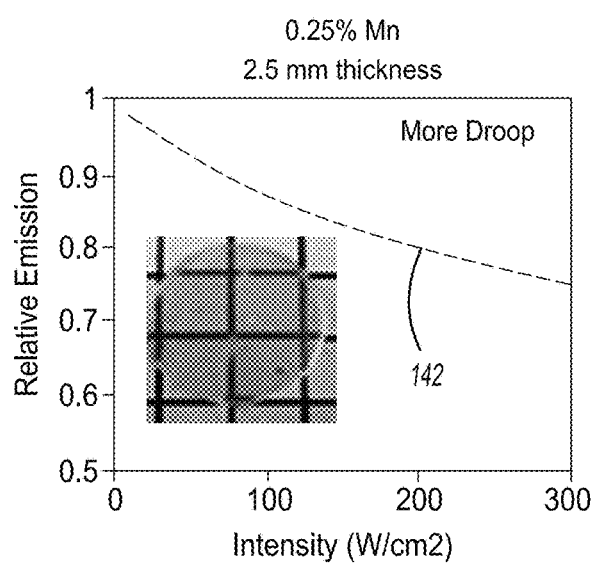

FIG. 5 shows photos of KSF:Mn ceramics with Mn doping ranging from 0.045-1% (top row), under 254 nm excitation in darkness (middle row), and under 365 nm excitation in room lights (bottom row) in room lights;

FIG. 6 shows the absorption spectra of the KSF:Mn ceramics of FIG. 5;

FIG. 7 shows that the emission spectra of KSF:Mn phosphor ceramic changes in intensity but not in spectral features, and its intensity tracks the absorption, shown in the inset (and also that the emission occurs in the desirable red region of 610-650 nm);

FIG. 8 shows a multicomponent ceramic that was fabricated by mixing 0.74 grams of KSF:0.045 wt % Mn powder with 0.06 grams of YAG:1 wt % Ce powder, followed by hot pressing to translucency, as well as illustrating the performance of ceramic with 450 nm blue light excitation, and comparing with the blackbody at this color temperature as well as the human eye sensitivity curve;

FIG. 9 shows the mitigated thermal quenching of a KSF ceramic (red triangle symbols) compared to KSF powder (open square symbols) for temperatures above 475 K (about 200 Celsius); and FIGS. 10a and 10b show plots of the decrease in conversion efficiency as a function of excitation power density for two ceramics, revealing that with lower Mn doping (FIG. 10a Mn=0.045%) the intensity droop is mitigated compared to the higher doping level (FIG. 10b Mn=0.25%).

DETAILED DESCRIPTION

Example embodiments will now be described more fully with reference to the accompanying drawings.

Phosphor ceramics are currently employed in LED lighting, mostly based on Ce-doped garnets and are deployed in fixtures requiring high incident blue LED flux, but they lack sufficient red emission mainly at 630 nm to provide warm white light efficiently. To produce white light with a spectrum comparable to incandescent bulbs, while maximizing electrical efficiency, a red phosphor is needed with narrow band emission near 630 nm. Low flux LED packages typically employ powdered phosphors in a polymer matrix, sometimes including a combination of Ce-doped garnet powders and $K_2SiF_6$:$Mn^{4+}$ (KSF) phosphor powder. The powder phosphors' performance is limited by the poor thermal conductivity, droop, and imperfect environmental stability of powders.

The co-inventors of the present disclosure have found that the K2SiF6:Mn4+(KSF) phosphor may be consolidated into ceramic form, and that multicomponent phosphor ceramics including KSF with garnets may be fabricated with good transparency or translucency into the KSF portion of the phosphor body. FIG. 1 shows one embodiment of a phosphor ceramic structure 10 being used to create a phosphor converted white light LED component 12. The white light LED component 12 makes use of a blue LED 14 and three phosphors arranged in distinct layers, which are formed into an integrated ceramic structure: a red phosphor, for example KSF:Mn (K2SiF6:Mn4+) 16, a green/yellow phosphor 18, for example a Ce-doped garnet), and a cyan phosphor 20 such as BaSi2O2N2:Eu (BSON). The phosphor ceramic structure 10 thus forms a "multicomponent" phosphor ceramic structure. To produce white light 22, some blue light 24 from the blue LED 14 is absorbed by each of the three phosphors 16, 18 and 20 which are arranged in a layered structure, and a small amount of the blue light 24 passes through unabsorbed.

Another example of an LED component 100 employing a phosphor ceramic structure 102 is shown in FIG. 2. The LED component 100 in this example likewise employs a blue LED excitation source 104 that generates blue light 106. The phosphor ceramic structure 102 in this example is likewise formed as an integrated ceramic structure with Ce-doped garnets, combined with KSF:Mn and a cyan phosphor (e.g., BSON), all mixed together as a homogenous mixture. The phosphor ceramic structure 102, which thus also forms a multicomponent phosphor structure, can provide a high CRI (e.g., >90), as well as high efficacy (>120 lm/W). The blue light 106 emitted from the blue LED excitation source 104 is absorbed by the phosphor ceramic structure 102, which absorbs a majority of the blue light to produce a white light 108. A small amount of the blue light 106 (e.g., typically about 10%-20%) passes through the phosphor ceramic structure 102 unabsorbed. Minimally, the phosphor composite invention contains the KSF ceramic with a green/yellow phosphor either in the form of a powder incorporated into the ceramic or applied to or near the surface of the KSF ceramic, or as an additional ceramic arranged as sequential horizontal layers traversed by the blue diode light or as dispersed phosphors in a KSF-based matrix separately encountering the blue light. Ce-doped garnets are the most common green phosphor although there are additional possibilities under development.

Figure 3:
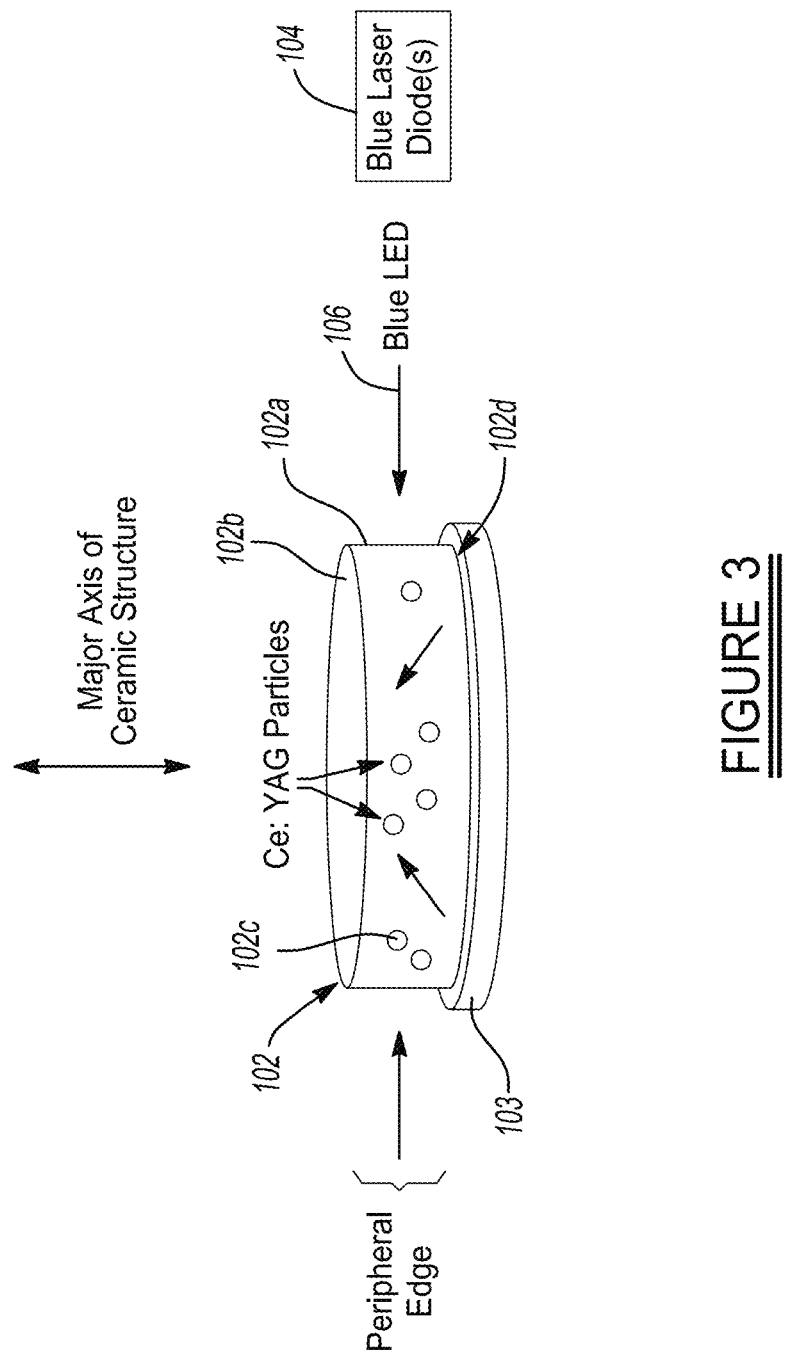
FIG. 3 is an embodiment of deploying the KSF ceramic phosphor, for the case of utilizing laser diode pumping (instead of an LED)

FIG. 3 depicts one geometry for pumping the transparent (or translucent) KSF phosphor ceramic structure 102 with blue light 106 from blue laser diodes 104 (LDs) rather than the far more conventional LEDs. Because laser output can be focused much more tightly than LEDs, for example it is possible to pump the laser light into the narrow peripheral side 102a of a phosphor disk rather than the larger face 102b. In the example shown in FIG. 3, the phosphor ceramic structure 102 includes Ce:YAG particles 102c. The phosphor ceramic structure may also include a reflective metal coating such as aluminum 102d and be supported on a heat sink 103.

Figure 4:
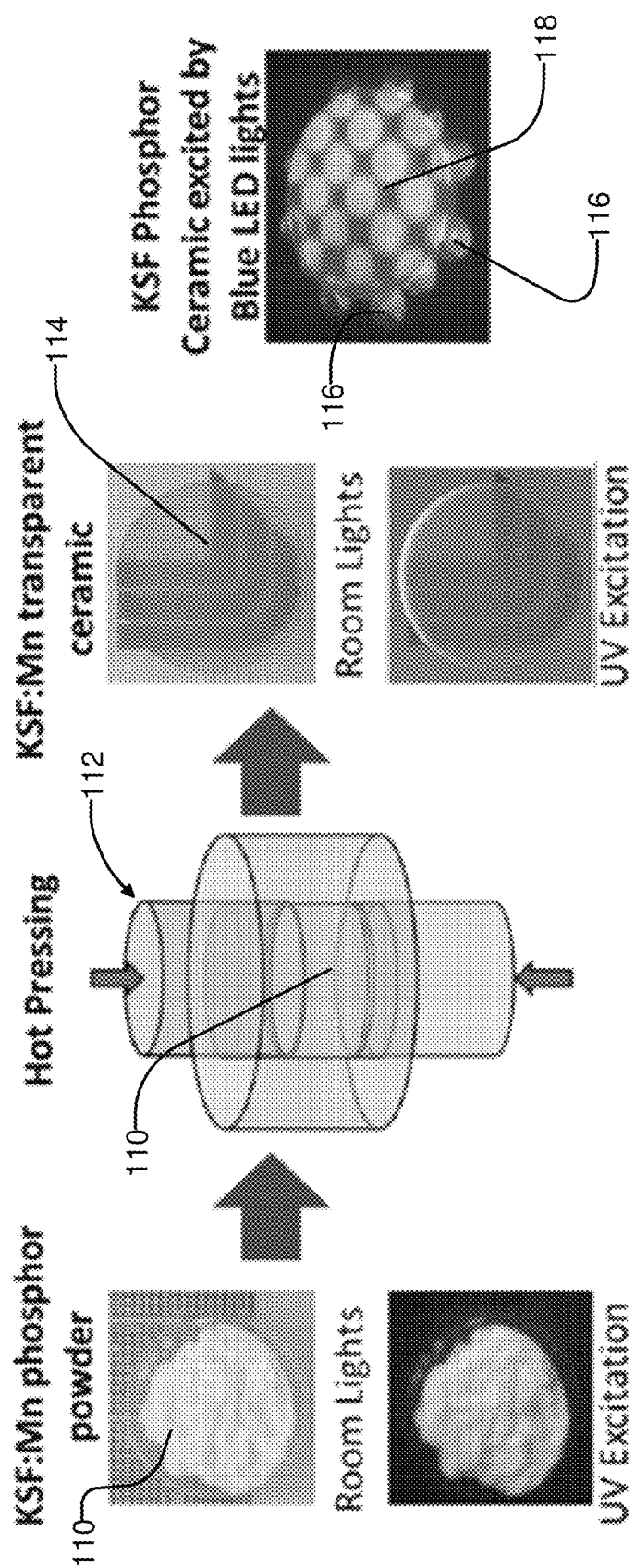
FIG. 4 is a simplified illustration showing how the multicomponent phosphor ceramic of FIG. 2 may be manufactured using a hot pressing operation.

Transparent ceramics such as the phosphor ceramic structures 10 and 102 shown in FIGS. 1 and 2, may be formed via a number of suitable methods including, but not limited to, vacuum sintering, controlled atmosphere sintering, hot-pressing, spark plasma sintering, 3D printing, among other methods, all of which are contemplated as feasible methods of manufacturing the various embodiments described herein. One process methodology for producing the phosphor ceramic structures 10 and 102 is shown in FIG. 4 in which the fluoride phosphor powder 110 is consolidated into a ceramic by heating at a temperature above room temperature and below the melting or decomposition temperature of the fluoride phosphor. In FIG. 4, KSF:Mn powder 110 is pressed in a hot pressing operation 112 at pressures of preferably about 1000-20,000 psi, and temperatures of preferably about 150-400° C. to achieve transparency. FIG. 4 also shows the resulting KSF phosphor ceramic 114 excited by blue LED lights 116, and emitting red light 118.

The thickness of the ceramic needed for a particular LED package is determined by the activator doping level and the absorption cross section of the phosphor ceramic at the LED emission wavelength. In most instances, however, it is anticipated that the thickness will be in the range of about 0.1 mm to 1 mm, but it will be appreciated that this range may vary considerably based on the design of a particular LED package. Use of thicker ceramics with lower $Mn^{4+}$ doping throughout a volume offers advantages of a lower temperature rise (if assumed to be heat-sunk) and also reduces excited state density which is likely to minimize the amount of "droop". The resulting KSF phosphor ceramic 114 exhibits comparable absorption (with optimized doping and thickness) and emission properties to the powdered KSF phosphor, as shown in FIGS. 5-7, with good transparency and conversion of blue light from blue light LEDs 116 into red light 118. FIG. 5 shows photos of KSF:Mn ceramics with Mn doping ranging from 0.045-1% along top row 120; under 254 nm excitation in darkness in the middle row 122; and under 365 nm excitation in room lights in the lower row 124. FIG. 6 shows graphs 126a-126e illustrating the absorption spectra of the KSF:Mn ceramics of FIG. 5 for the different percentages shown in FIG. 5. The graph 128 of FIG. 7 shows that the emission spectra of KSF:Mn phosphor ceramic changes in intensity but not in spectral features. Furthermore, its intensity tracks the absorption, shown in the inset graph 128a by emission curve 128a1 and absorbance curve 128a2 (and also that the emission occurs in the desirable red region of 610-650 nm). In particular, note in FIG. 7 that the emission occurs in the desirable red region of 600-650 nm, which enables high CRI ("whiteness") and sufficient R9 (i.e., red component) to be achieved.

In addition to the single phosphor KSF:Mn ceramic shown in FIG. 5, the fluoride phosphor matrix ceramic approach described herein may be extended to development of multicomponent phosphor ceramics or "white emitting" ceramics, such as shown in FIGS. 1-3. By controlling the relative amounts of one or more phosphor powders in the manufactured multicomponent ceramic, the color point or "correlated color temperature" (CCT) may be tuned for different fields of use.

FIG. 8 shows an example of a multicomponent phosphor ceramic 132 (inset) that was fabricated by mixing 0.74 grams of KSF:0.045 wt % Mn powder with 0.06 grams of YAG:1 wt % Ce powder, followed by hot pressing to translucency with a controlled amount of scatter afforded by the particles. FIG. 8 shows the appearance of the mixed phosphor ceramic 132 backlit with 450 nm blue light excitation (inset picture). The multicomponent phosphor ceramic 132 (i.e., mixed $K_2SiF_6$:Mn and $Y_3Al_5O_{12}$:Ce phosphors) provides luminescence minimally altered from the constituent powder phosphors, but embedded within an inert fluoride matrix. In particular, in FIG. 8 it can be seen that the multicomponent phosphor ceramic 132 emits desirable warm white light 138 under the blue LED 138a excitation, as indicated by curve 135a. Curve 135b compares a sensitivity of the human eye at this color temperature, and curve 135c compares a blackbody curve at this color temperature.

The multicomponent phosphor ceramic 10, 102, 114 or 132 described ceramic herein may have a density >80% of the single-crystal's full density of the phosphor, and more preferably reach >90% of the full density, and even more preferably being consolidated to >99% of the full density. Most generally, the invention comprises a Manganese-doped fluoride ceramic as the red-emitting component.

The fluoride phosphor powder used to form the multicomponent phosphor ceramics 10 and 102 described herein preferably has a cubic structure, and more preferably the $K_2PtCl_6$ cubic structure type. The specific phosphor selected may have the chemical formula $M_2M'F_6$, where M is at least one monovalent ion, and M' is at least one tetravalent ion, and wherein the selected monovalent and tetravalent ions form a stable compound. The phosphor and phosphor matrix selected may, for example, be comprised of M=Li, Na, K, Rb, Cs or mixtures thereof, and M' being comprised of Si, Ge, Sn, Ti, Zr, Hf or mixtures thereof. In various implementations of the phosphor ceramic structures 10 or 102, one or more of the following ceramics are used: $Li_2SiF_6$, $Na_2SiF_6$, $K_2SiF_6$, $Rb_2SiF_6$, $Cs_2SiF_6$, $Li_2GeF_6$, $Na_2GeF_6$, $K_2GeF_6$, $Rb_2GeF_6$, $Cs_2GeF_6$, $Li_2SnF_6$, $Na_2SnF_6$, $K_2SnF_6$, $Rb_2SnF_6$, $Cs_2SnF_6$, $Li_2ZrF_6$, $Na_2ZrF_6$, $K_2ZrF_6$, $Rb_2ZrF_6$, $Cs_2ZrF_6$, $Li_2HfF_6$, $Na_2HfF_6$, $K_2HfF_6$, $Rb_2HfF_6$, $Cs_2HfF_6$, $Li_2TiF_6$, $Na_2TiF_6$, $K_2TiF_6$, $Rb_2TiF_6$, and $Cs_2TiF_6$, and in some implementations two or more mixtures or solid solutions thereof are used. In one example the selected phosphor is doped with $Mn^{4+}$. In one example the Me doping level is between 0.01% to 30%, and more preferably being between 0.01% to 5%.

As noted above, the ceramic structures 10 and 102 and 114 may be comprised of a doped or undoped transparent or translucent ceramic matrix, with one or more additional phosphors dispersed in the matrix. If one or more additional phosphors are used, they may be consolidated into a single ceramic structure as distinct particles which form within the fluoride phosphor comprising the ceramic structure. Each one of the differing phosphors may emit at wavelengths which differ from one another. One or more of the additional phosphors may be selected from among the colors cyan, green, yellow, or further orange or red emission. One or more of the additional phosphors may comprise an oxide garnet, such as Ce-doped $(Lu,Gd,Y)_3(Al,Ga)_5O_{12}$ compounds, or a nitride phosphor, or an oxynitride phosphor or a sulfide phosphor, or a selenide phosphor.

FIG. 9 illustrates the improved thermal conductivity of phosphor ceramics as compared to powders. Graph 134 illustrates the falloff in intensity as a function of temperature for KSF:1% ceramic, while graph 136 shows the intensity vs. temperature falloff for KSF:1% Mn powder. The improved thermal conductivity of phosphor ceramics mitigates the temperature rise due to "nonradiative decay" pathways that are active at high pump powers, and from the unavoidable "Stokes loss" derived from the energy deposited into phonons when the blue LED light is absorbed by the phosphor and then converted into longer wavelength light. This is seen particularly well in the graph 134 of FIG. 9. Single or multicomponent phosphor ceramics fabricated by consolidating one or more phosphor powders within an undoped fluoride matrix improves the thermal conductivity by about one or more orders of magnitude, compared to powders dispersed in a silicone or other organic polymer. If the phosphor ceramic is configured with a heat sink to keep the ceramic temperature low, it can permit the use of higher excitation flux than is possible for phosphor powders. For example, Ce:YAG powder embedded in polymer has thermal conductivity of k<1 W/m-K while a dense Ce:YAG ceramic has a much higher k of ~10 W/m-K. We have measured the KSF ceramics thermal conductivity at ~1 W/m-K, and may presume that the thermal conductivity of powdered KSF phosphor in silicone is about 10× lower (i.e. 0.1), similar to the garnet case. The use of higher flux, in turn, can reduce the number of LEDs needed per lumen of white light. The ceramic phosphor can therefore be used with a higher blue light pump flux, since heat generated may be efficiently conducted away (most efficiently if held in a heat sink structure), thus minimizing thermal quenching at high power. FIG. 9 shows the mitigated thermal quenching of a KSF ceramic compared to KSF powder for temperatures above 475° K (about 200° Celsius). In FIG. 9, the graph 136 shows emission as a function of temperature, acquired with 450 nm excitation for $K_2SiF_6$:Mn powder (open square symbols), while graph 134 shows the performance of $K_2SiF_6$:Mn ceramic (red triangle symbols) over the same temperature range. Significant luminescence quenching is observed in graph 136 for the powder phosphor at >475° K, limiting the incident excitation flux that may be used. For the KSF ceramic performance shown in graph 134, emission at temperatures >500° K does not exhibit quenching. This is believed to be due to improved thermal conductivity of the ceramic as well as the reduced light intensity in the KSF phosphor.

While nearly all oxide phosphors are stable in the ambient for expected device lifetimes of >30 years, fluorides and nitrides exhibit degradation in humid environments. Fluoride ceramics are more stable in ambient humidity compared to powders. Since the $K_2SiF_6$:$Mn^{4+}$ phosphor is known to be susceptible to degradation due to reaction with water, this may be an important advantage afforded by KSF ceramics versus KSF powders. Water reacting with $Mn^{4+}$ can turn the phosphor black, likely due to leaching of Mn out of the KSF structure and its conversion into $MnO_2$ (a dark brown substance). To address this issue, commercial $K_2SiF_6$:$Mn^{4+}$ phosphor powder is often synthesized with a shell of undoped $K_2SiF_6$ on the surface of particles, to prevent water from reacting with $Mn^{4+}$ and darkening the body color of the phosphor. Even more preferably, phosphor ceramics of $K_2SiF_6$:$Mn^{4+}$ can be fabricated encapsulated in a shell of undoped KSF, a polymer, glass or other material with resistance to water diffusion, for example using a >100 micron thick layer, thus providing a protective coating of even greater durability for the ceramic.

While many fluoride hosts may be considered as phosphor ceramic matrix, KSF offers a particularly low refractive index of 1.34 (at 589 nm), resulting in improved light extraction compared to other polymer and ceramic host candidates due to a reduction in the amount of total internal reflection. This low refractive index permits luminescence from any phosphor suspended within it to more readily escape from the front surface of the phosphor ceramic and reduces the photon "flight path" length prior to escape.

For the KSF phosphor, use in the form of a KSF ceramic permits lower Mn doping, since the excitation volume in a transparent or translucent ceramic can be significantly larger (e.g., >1 $mm^3$, compared to <0.05 $mm^3$ in a powder). Lower Mn doping reduces concentration quenching (by Auger upconversion and cross-relaxation), and thereby mitigates thermal quenching arising from these deactivation pathways. Physical clustering of Mn when doping levels are high is likely the basis for degraded emission properties with high Mn doping, and can be nearly entirely avoided by use of lower Mn concentrations, as is enabled by employment of KSF in ceramic form. Experimentally, the advantage of a transparent (or translucent) phosphor ceramic over the usual incorporation of particles in a polymer relates to larger excitation volume for more transparent phosphor ceramics, as described above, where the blue pump (i.e., excitation) light excites a larger volume (e.g., blue LED excitation light).

In FIGS. 10a and 10b, the "droop" performance of two KSF:Mn ceramics were tested as a function of the blue light power level. FIG. 10a shows the "droop" performance via graph 140 of KSF:Mn ceramic doped with 0.045 percent weight of Mn, while FIG. 10b shows the droop performance via graph 142 of KSF:Mn ceramic doped with 0.25 percent weight of Mn. It is apparent from graph 142 in FIG. 10b that the higher Mn-doped ceramic exhibits a stronger down-turn at the highest power level. It will be appreciated that the use of lower Mn doping in KSF is only useful in a transparent or translucent ceramic, not in an opaque powder. A key aspect of this effect is that the thermal conductivity of a KSF:Mn ceramic structure constructed in accordance with the present disclosure may be expected to be at least about, or greater than, 5× higher than the typical polymer film.

The teachings presented herein enable single phosphor or multicomponent phosphor powders to be consolidated into single component or multicomponent ceramic structures. The single and multicomponent phosphor ceramic structures described herein enable a tunable light emission (e.g., tunable white light emission) to be achieved from a blue pump light excitation source, with an effective low refractive index for more efficient light extraction. The embodiments of the phosphor ceramic structures described herein offer significantly improved thermal stability and thermal conductivity as compared to powdered phosphors contained in a binder.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The color description such as "red" or "green" are not intended to be restrictive such that "red" may be interpreted as "orange" or "orange/red" and for example "green" may be "yellow/green".

What is claimed is:

1. An LED component comprising:
   a light emitting diode configured to generate a first wavelength comprising blue light; and
   a single-layered phosphor composite structure positioned adjacent to the LED, the single-layered phosphor composite structure comprising:
      a fluoride phosphor matrix configured to emit light at a second wavelength comprising orange or red light when irradiated by the first wavelength, and
      a plurality of distinct additional phosphor particles homogenously integrated within the fluoride phosphor matrix, the distinct additional phosphor particles configured to emit light at a third wavelength that is different from the second wavelength when irradiated by the first wavelength, the third wavelength comprising cyan, green, or yellow light,
   wherein a first amount of relative photon emission of the single-layered phosphor composite structure and a second amount of relative photon emission of the light emitting diode together generate white light, the first amount being greater than the second amount, and the first amount including a third amount of relative photon emission of the fluoride phosphor matrix and a fourth amount of relative photon emission of the distinct additional phosphor particles, the fourth amount being greater than the third amount.

2. The LED component of claim 1, wherein the fluoride phosphor matrix includes a cubic or near-cubic $K_2PtCl_6$ structure type.

3. The LED component of claim 1, wherein the fluoride phosphor matrix comprises $M_2M'F_6$, where M is selected from the group consisting of: Li, Na, K, Rb, Cs, and combinations thereof, and M' is selected from the group consisting of: Si, Ge, Sn, Ti, Zr, Hf, and combinations thereof.

4. The LED component of claim 1, wherein the fluoride phosphor matrix comprises: $K_2SiF_6$, $Li_2SiF_6$, $Na_2SiF_6$, $Rb_2SiF_6$, $Cs_2SiF_6$, $K_2GeF_6$, $Li_2GeF_6$, $Na_2GeF_6$, $Rb_2GeF_6$, $Cs_2GeF_6$, $Li_2SnF_6$, $Na_2SnF_6$, $Rb_2SnF_6$, $Cs_2SnF_6$, $K_2ZrF_6$, $Li_2ZrF_6$, $Na_2ZrF_6$, $Rb_2ZrF_6$, $Cs_2ZrF_6$, $K_2HfF_6$, $Li_2HfF_6$, $Na_2HfF_6$, $Rb_2HfF_6$, $Cs_2HfF_6$, $K_2TiF_6$, $Li_2TiF_6$, $Na_2TiF_6$, $Rb_2TiF_6$, $Cs_2TiF_6$, or any mixtures or solid solutions thereof.

5. The LED component of claim 1, wherein the fluoride phosphor matrix is doped with Mer.

6. The LED component of claim 5, wherein a $Mn^{4+}$ doping level is between 0.01% to 30%.

7. The LED component of claim 5, wherein the $Mn^{4+}$ doping level is between 0.01% and 5%.

8. The LED component of claim 1, wherein the single-layered phosphor composite structure is formed by heating the fluoride phosphor matrix to a temperature above room temperature and below a melting or decomposition temperature of the fluoride phosphor matrix while under pressure, the pressure being applied by a hot-press.

9. The LED component of claim 1, wherein the plurality of distinct additional phosphor particles comprises an oxide phosphor, the oxide phosphor including Ce-doped $(Lu,Gd,Y)_3(Al,Ga)_5O_{12}$ garnet compounds.

10. The LED component of claim 1, wherein the plurality of distinct additional phosphor particles comprises an oxide phosphor, a nitride phosphor, an oxynitride phosphor, a sulfide phosphor, an oxysulfide phosphor, a selenide phosphor, or any combination thereof.

11. The LED component of claim 1, wherein the single-layered phosphor composite structure is disposed in a heat-sink structure that is configured to remove heat from the single-layered phosphor composite structure.

12. The LED component of claim 1, wherein the thermal conductivity of the single-layered phosphor composite structure exhibits a value of about k ~1.0 W/m-K at 25° C.

13. The LED component of claim 1, further comprising another phosphor in contact or not in contact with a surface of the single-layered phosphor composite structure as further distinct particles, the another phosphor emits light at a fourth wavelength that is different from the first and second wavelengths, the third wavelength is selected from the colors cyan, green or yellow.

14. The LED component of claim 13, wherein the further distinct particles of the another phosphor are incorporated into an organic binder, and the organic binder comprises a polymer.

15. The LED component of claim 1, wherein the single-layered phosphor composite structure has a density of 90% of a full density.

16. The LED component of claim 1, wherein the single-layered phosphor composite structure has a density of 99% of a full density.

17. The LED component of claim 1, wherein the third amount is greater than the second amount and the fourth amount is greater than the second amount.

18. The LED component of claim 1; wherein the first amount is about 87% and the second amount is about 13%.

19. The LED component of claim 1, wherein the second amount is about 13%, the third amount is about 31%, and the fourth amount is about 56%.

20. The LED component of claim 1, wherein the plurality of distinct additional phosphor particles is a first plurality of distinct additional phosphor particles and the single-layered phosphor composite structure further comprises a second plurality of distinct additional phosphor particles homogeneously integrated within the fluoride phosphor matrix, the second plurality of additional phosphor particles configured to emit light at a fourth wavelength that is different from the second wavelength and the third wavelength when irradiated by the first wavelength.

21. The LED component of claim 20, wherein the third wavelength comprises green or yellow and the fourth wavelength comprises cyan.

22. A laser diode-based lighting component comprising:
a laser diode (LD) configured to generate a first wavelength comprising blue light; and
a single integrated phosphor composite structure positioned adjacent to the LD, the single integrated phosphor composite ceramic structure comprising:
a transparent or translucent fluoride phosphor ceramic configured to emit light at a second wavelength comprising orange or red light when irradiated by the first wavelength; and
a plurality of distinct phosphor particles homogeneously integrated within the fluoride phosphor ceramic, the distinct phosphor particles configured to emit light at a third second wavelength that is different from the second wavelength when irradiated by the first wavelength, the third wavelength comprising colors cyan, green, or yellow light,
wherein a first amount of relative photon emission of the single-layered phosphor composite structure and a second amount of relative photon emission of the laser diode together generate white light, the first amount being greater than the second amount, and the first amount including a third amount of relative photon emission of the fluoride phosphor ceramic and a fourth amount of relative photon emission of the distinct additional phosphor particles, the fourth amount being greater than the third amount.

23. The laser diode-based lighting component of claim 22, wherein the LD is disposed adjacent to a minor length of the single integrated phosphor composite structure, generally perpendicular to an axis extending along a major length of the single integrated phosphor composite ceramic structure.

24. A laser diode excited phosphor comprising:
a single-layered integrated composite structure comprising:
a fluoride phosphor matrix configured to emit light at a first wavelength comprising orange or red light,
a plurality of additional phosphor particles homogeneously integrated within the fluoride phosphor matrix, the plurality of additional phosphor particles configured to emit light at a second wavelength that is different from the first wavelength, the second wavelength comprising colors cyan, green, or yellow light,
wherein the single-layered integrated composite structure is substantially free of an organic binder,
wherein the single-layered integrated composite structure is configured to be disposed adjacent to a laser diode excitation light source that emits light of a third wavelength that is different from the first and second wavelengths, the third wavelength comprising blue light, and
wherein the single-layered integrated ceramic structure is configured to modify the light of the third wavelength passing therethrough to emit white light, wherein the white light includes a first amount of relative photon emission of the single-layered integrated composite structure and a second amount of relative photon emission of the laser diode excitation light source, the first amount being greater than the second amount, and the first amount including a third amount of relative photon emission of the fluoride phosphor matrix and a fourth amount of relative photon emission of the distinct additional phosphor particles, the fourth amount being greater than the third amount.

25. The light emitting device of claim 24, wherein the device further comprises at least one of additional phosphors, heat-sinks, electrical power conversion modules, arrays of additional blue light emitting diodes (LEDs), fixturing, electrodes for electrical contact, means physical support, and secondary optical components.

26. A light emitting component comprising:
a light emitting diode (LED) or laser diode (LD) operable to emit blue;
a phosphor ceramic adjacent to the light emitting diode or laser diode and operable to emit orange or red, the phosphor ceramic comprising $K_2SiF_6:Mn^{+4}$; and
a plurality of phosphor particles homogeneously dispersed in the phosphor ceramic and operable to emit cyan, green, or yellow,
wherein the blue emitted by the light emitting diode or laser diode, the orange or red emitted by the phosphor ceramic, and the cyan, green, or yellow emitted by the plurality of phosphor particles together generate a white light, a relative photon emission of the light emitting diode or laser diode being less than a relative photon emission of the phosphor ceramic, and the relative photon emission of the phosphor ceramic being less than a relative photon emission of the plurality of phosphor particles.

27. The light emitting component of claim 26, wherein the plurality of phosphor particles comprises Ce-doped garnet particles.

28. The light emitting component of claim 27, wherein the Ce-doped garnet particles comprise YAG:Ce particles.

\* \* \* \* \*